(12) United States Patent
Hu et al.

(10) Patent No.: US 8,916,404 B2
(45) Date of Patent: Dec. 23, 2014

(54) E-PAPER ARRAY SUBSTRATE WITH STORAGE CAPACITOR ELECTRODE AND MANUFACTURING METHOD THEREOF

(75) Inventors: Wenjie Hu, Beijing (CN); Zenghui Sun, Beijing (CN); Hongyu Liu, Beijing (CN); Gang Wang, Beijing (CN); Xibin Shao, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 869 days.

(21) Appl. No.: 12/628,878

(22) Filed: Dec. 1, 2009

(65) Prior Publication Data

US 2010/0200856 A1    Aug. 12, 2010

(30) Foreign Application Priority Data

Feb. 12, 2009    (CN) .......................... 2009 1 0077717

(51) Int. Cl.
*H01L 21/00*    (2006.01)
*H01L 27/12*    (2006.01)
*H01L 21/28*    (2006.01)
*H01L 33/00*    (2010.01)

(52) U.S. Cl.
CPC ........ *H01L 27/1214* (2013.01); *H01L 27/1288* (2013.01); *H01L 21/28* (2013.01); *H01L 33/00* (2013.01)
USPC .......................................................... 438/34

(58) Field of Classification Search
CPC ...... H01L 27/1255; H01L 33/00; H01L 21/28
USPC .............................................................. 438/34
See application file for complete search history.

(56) References Cited

U.S. PATENT DOCUMENTS 5,633,175 A * 5/1997 Kikuchi et al. .................. 438/30
7,391,049 B2 * 6/2008 Hirai ................................ 257/40
2008/0191278 A1 * 8/2008 Maekawa ....................... 257/347

FOREIGN PATENT DOCUMENTS

| CN | 1819125 | A | 8/2006 | |
| CN | 101364572 | * | 2/2009 | ............ H01L 21/336 |
| CN | 101364572 | A | | 2/2009 |

OTHER PUBLICATIONS

Chinese Notification of Reexamination dated Feb. 20, 2014; Appln. No. 200910077717.5.

* cited by examiner

*Primary Examiner* — Kimberly Rizkallah
*Assistant Examiner* — Alexander Belousov
(74) *Attorney, Agent, or Firm* — Ladas & Parry LLP

(57) ABSTRACT

A method for manufacturing E-paper array substrate and an E-paper array substrate are provided. The method for manufacturing E-paper array substrate uses two masks. Steps on a surface of the array substrate structure are eliminated, so as to facilitate a subsequent coating process of E-ink and enable a uniform distribution of a drain electric field. An E-paper array substrate is further provided.

7 Claims, 5 Drawing Sheets

E-PAPER ARRAY SUBSTRATE WITH STORAGE CAPACITOR ELECTRODE AND MANUFACTURING METHOD THEREOF

CROSS-REFERENCE TO RELATED APPLICATIONS

This application claims priority to Chinese Patent Application No. 200910077717.5, filed on Feb. 12, 2009, entitled "A Method for Manufacturing E-paper Array Substrate and E-paper Array Substrate", which is incorporated herein by reference in its entirety.

FIELD OF THE TECHNOLOGY

The present invention relates to a reflection display technology, and more particularly to a method for manufacturing E-paper array substrate and an E-paper array substrate.

BACKGROUND

With continuous development of technology, electronic and digital products are renewed more and more frequently and various new products are manufactured at the same time. E-paper is also called digital paper. As a resultant of a combination of information display characteristics of ordinary paper and characteristics of a computer display screen, the E-paper is a new product emerging in the digital product market in recent years. Since the E-paper can reproduce the display characteristics of the ordinary paper and is reusable, consumption in the ordinary paper may be reduced, and no great damage is caused to environment. In addition, the E-paper has many advantages such as motion picture display. Therefore, the E-paper will replace ordinary paper documents as a display means.

FIG. 1 is a schematic structural view of an E-paper. Active E-paper is mainly formed by an upper substrate 1, an E-ink layer 2, and a lower substrate 3. The E-paper display is a reflective display which needs no background light source and displays data by reflecting an environment light source. The E-ink layer 2 contains white pigment particles 21 and black pigment particles 22, in which the white pigment particles 21 having a good reflecting ability are used to display a bright state, while the black pigment particles 22 having a good absorbing ability are used to display a dark state. Since the E-paper needs no background light source, a thin film transistor (TFT) array substrate driving the E-paper and a substrate driving a liquid crystal display (LCD) are of different structures. The manufacturing process of an array substrate driving the E-paper has gradually become mature in recent years, but is mainly based on a 5mask or 4mask process, with complex process and high cost. Someone has proposed to directly use a drain electrode as a driving electrode to simplify the above process, and fabricate the array substrate driving the E-paper only with a 2mask. FIG. 2 is a schematic structural view of an E-paper array substrate in the prior art. As shown in FIG. 2, the array substrate fabricated by the 2mask process is formed by a glass substrate (Glass) 4, a gate electrode (Gate) 5, a storage capacitor bottom electrode (Cs bottom electrode) 6, an insulator layer (Insulator) 7, an amorphous silicon (a-Si) layer 8, an n+ a-Si layer 9, a source/drain (S/D) metal layer 10, and a passivation film (PVX) 11. However, such a method causes steps in the structure of the array substrate, for example, unevenness in the surface of the passivation film 11 in FIG. 2, which causes difficulties in the coating of E-ink during the subsequent process and non-uniform distribution of a drain electric field, thus affecting the display effect of the E-paper.

SUMMARY

The present invention is directed to a method for manufacturing E-paper array substrate and an E-paper array substrate, for eliminating steps on a surface of the array substrate structure without changing number of masks, so as to facilitate the coating of the E-ink and enable a uniform distribution of a drain electric field, thereby enhancing the display effect of the E-paper.

In order to achieve the above objectives, the present invention provides a method for manufacturing E-paper array substrate, which includes the following steps.

Step 1: an insulating leveling layer is deposited on a glass substrate, and patterns of a gate electrode and a storage capacitor bottom electrode are formed by photolithography using a first mask.

Step 2: a metal layer is deposited on the glass substrate obtained after the Step 1, and the gate electrode and the storage capacitor bottom electrode are formed by photolithography using the first mask.

Step 3: an insulator layer, an amorphous silicon layer, an n+ amorphous silicon layer and a source/drain metal layer are respectively deposited on the glass substrate obtained after the Step 2, and a source/drain electrode and a channel region are formed by photolithography using a second mask.

Step 4: the glass substrate obtained after the Step 3 is coated with a passivation film.

The present invention further provides an E-paper array substrate, which includes: a glass substrate, a leveling layer, a gate electrode, a storage capacitor bottom electrode, an insulator layer, an amorphous silicon layer, an n+ amorphous silicon layer, a source/drain metal layer and a passivation film. The leveling layer, the gate electrode and the storage capacitor bottom electrode together form an electrode layer with a uniform thickness, and the electrode layer is located on the glass substrate.

The method for manufacturing E-paper array substrate and the E-paper array substrate provided in the present invention eliminate steps on a surface of an array substrate structure without changing the number of masks by disposing a leveling layer on a glass substrate, so as to enable a uniform distribution of a drain electric field and facilitate a subsequent coating process of E-ink, thereby enhancing the display effect of an E-paper.

BRIEF DESCRIPTION OF THE DRAWINGS

The present invention will become more fully understood from the detailed description given herein below for illustration only, and thus are not limitative of the present invention, and wherein.

Figure 1:
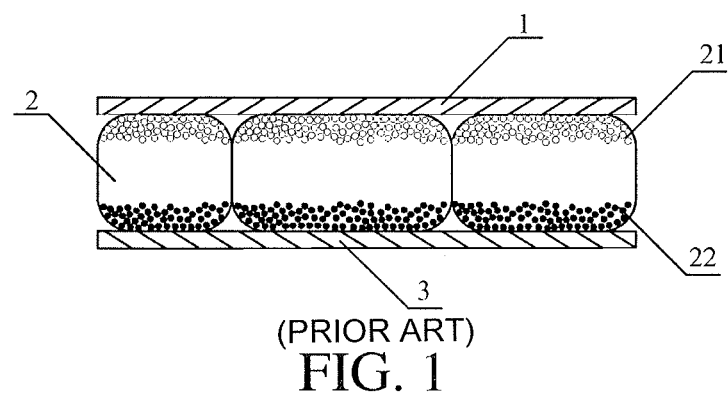
FIG. 1 is a schematic structural view of an E-paper.

In the drawings:
1—upper substrate; 2—E-link layer; 3—lower substrate;
21—white pigment particles; 22—black pigment particles; 4—glass substrate;
5—gate electrode; 6—storage capacitor bottom electrode; 7—insulator layer;
8—amorphous silicon layer; 9—n+ a-Si layer; 10—source/drain metal layer;
11—passivation film; 12—insulating leveling layer.

DETAILED DESCRIPTION

The technical solutions of the present invention are further described below in detail through the accompanying drawings and the embodiments.

Figure 3:
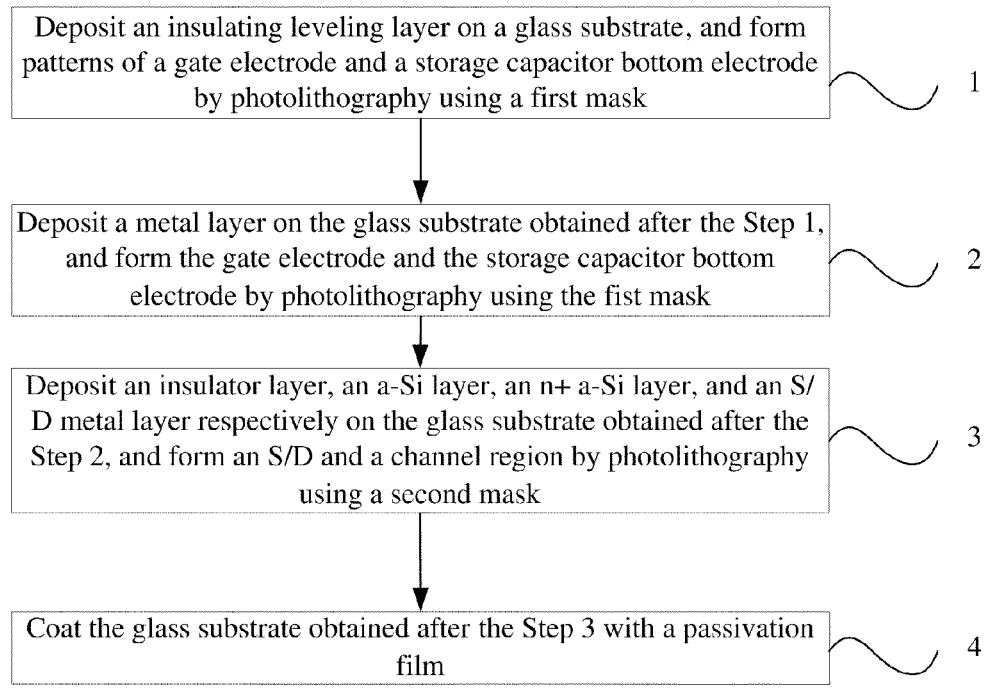
FIG. 3 is a flow chart of an embodiment of a method for manufacturing E-paper array substrate according to the present invention.

FIG. 3 is a flow chart of an embodiment of a method for manufacturing E-paper array substrate according to the present invention. Referring to FIG. 3, the method for manufacturing E-paper array substrate provided in this embodiment specifically includes the following steps.

In Step 1, an insulating leveling layer is deposited on a glass substrate, and patterns of a gate electrode and a storage capacitor bottom electrode are formed by photolithography using a first mask.

Figure 4:
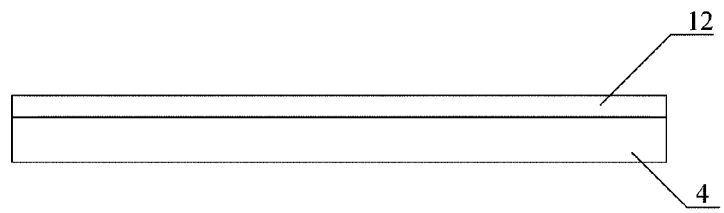
FIG. 4 is a schematic view illustrating a first process in the embodiment of the method for manufacturing E-paper array substrate according to the present invention.
Figure 5:
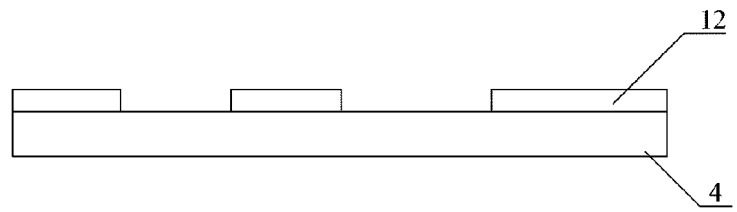
FIG. 5 is a schematic view illustrating a second process in the embodiment of the method for manufacturing E-paper array substrate according to the present invention.

The method for manufacturing a substrate provided in this embodiment is a method for manufacturing an array substrate driving a reflective display, for example, a method for manufacturing an array substrate driving an E-paper. FIGS. 4-12 are schematic views illustrating various processes in the embodiment of the method for manufacturing E-paper array substrate according to the present invention. The method for manufacturing E-paper array substrate in this embodiment will be explained in detail below with reference to the accompanying drawings. In this step, an insulating leveling layer is first deposited on a glass substrate. FIG. 4 is a view illustrating a first process in the embodiment of the method for manufacturing E-paper array substrate according to the present invention, that is, a schematic view obtained after the insulating leveling layer 12 is deposited on the glass substrate 4 in this step. Specifically, the insulating leveling layer 12 may be deposited using the plasma enhanced chemical vapor deposition (PECVD) technology. After the insulating leveling layer 12 shown in FIG. 4 is deposited, patterns of a gate electrode and a storage capacitor bottom electrode are formed by photolithography using a first mask. FIG. 5 is a view illustrating a second process in the embodiment of the method for manufacturing E-paper array substrate according to the present invention, that is, a schematic view obtained after the patterns of the gate electrode 5 and the storage capacitor bottom electrode 6 are formed by photolithography in this step. A material of the insulating leveling layer 12 may be silicon nitride (SiNx), silicon oxide, or a photoresist. When the material of the insulating leveling layer 12 is SiNx or silicon oxide, the forming the patterns of the gate electrode 5 and the storage capacitor bottom electrode 6 by photolithography in this step specifically includes: forming the patterns of the gate electrode 5 and the storage capacitor bottom electrode 6 by photolithography with a negative photoresist using the first mask. Specifically, the photolithography may be performed by an ordinary photolithography method, in which first, the insulating leveling layer 12 shown in FIG. 4 is coated with the negative photoresist, the first mask is placed on the insulating leveling layer 12 coated with the negative photoresist, and the photoresist is exposed and developed; then, a part of the insulating leveling layer 12 not covered by the photoresist is etched; and finally, the photoresist is removed, so as to obtain the schematic view of the patterns of the gate electrode 5 and the storage capacitor bottom electrode 6 shown in FIG. 5. When the material of the insulating leveling layer 12 is a negative photoresist, the forming the patterns of the gate electrode 5 and the storage capacitor bottom electrode 6 by photolithography using the first mask specifically includes: directly coating the glass substrate 4 with the negative photoresist, and exposing and developing the insulating leveling layer 12 using the first mask so as to obtain the patterns of the gate electrode 5 and the storage capacitor bottom electrode 6. Since the insulating leveling layer 12 directly employs the photoresist as the material, the schematic view of the patterns of the gate electrode 5 and the storage capacitor bottom electrode 6 shown in FIG. 5 can be obtained by only exposing and developing the insulating leveling layer 12 using the first mask, In Step 2, a metal layer is deposited on the glass substrate obtained after the Step 1, and the gate electrode and the storage capacitor bottom electrode are formed by photolithography using the first mask.

Figure 6:
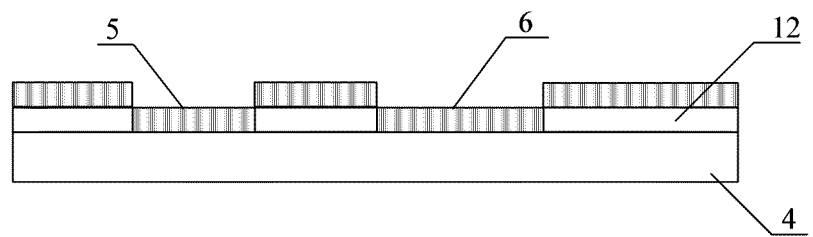
FIG. 6 is a schematic view illustrating a third process in the embodiment of the method for manufacturing E-paper array substrate according to the present invention.
Figure 7:
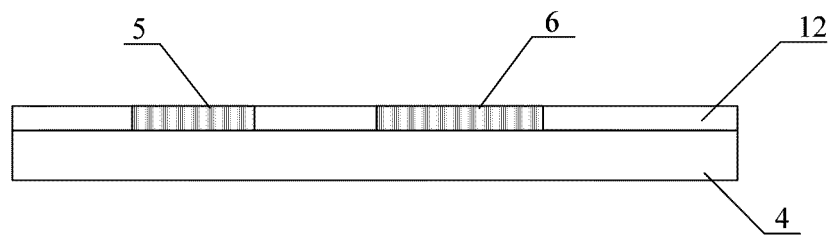
FIG. 7 is a schematic view illustrating a fourth process in the embodiment of the method for manufacturing E-paper array substrate according to the present invention.

After the schematic view shown in FIG. 5 is obtained after the Step 1, a metal layer is deposited on the insulating leveling layer 12 obtained after the photolithography, so as to obtain the schematic view shown in FIG. 6 after the metal layer is deposited, and afterwards, the gate electrode 5 and the storage capacitor bottom electrode 6 are formed by photolithography using the first mask, so as to obtain the schematic view shown in FIG. 7. Specifically, the metal layer may be deposited on the glass substrate 4 by sputtering, and a material of the metal layer may be AlNdMo. The step of forming the gate electrode 5 and the storage capacitor bottom electrode 6 by photolithography using the first mask may specifically include: forming the gate electrode 5 and the storage capacitor bottom electrode 6 by photolithography with a positive photoresist using the first mask. Specifically, the photolithography may be performed by an ordinary photolithography method which will not be described herein again. In this step, the first mask is still used, but the employed photoresist is the positive photoresist. In this way, the photoresist on the metal layer overlapping the insulating leveling layer 12 is exactly removed after the exposure and development, while the metal layer not overlapping the insulating leveling layer 12 is maintained in the etching, so that the insulating leveling layer 12 obtained after the photolithography and the metal layer obtained after the photolithography are completely complementary to each other, thus forming an electrode layer with a uniform thickness together.

Figure 2:
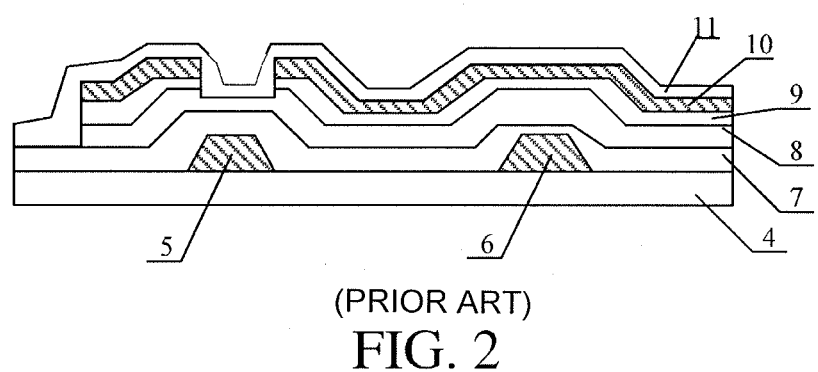
FIG. 2 is a schematic structural view of an E-paper array substrate in the prior art.

In this embodiment, in the manufacturing of the array substrate, first, an insulating leveling layer is deposited on a glass substrate, and patterns of a gate electrode and a storage capacitor bottom electrode are formed by photolithography on the insulating leveling layer using a first mask, and then, the gate electrode and the storage capacitor bottom electrode are formed by photolithography on a metal layer using the first mask. The patterns of the gate electrode and the storage capacitor bottom electrode formed by photolithography and the gate electrode and storage capacitor bottom electrode formed by photolithography are different. They are complementary to each other, so as to together form an electrode layer with a uniform thickness. That is to say, in this embodiment, the insulating leveling layer fills the regions other than the gate electrode and the storage capacitor bottom electrode, so that the surface of the layer where the gate electrode and the storage capacitor bottom electrode are located is flat, thus overcoming the unevenness of the layer where the gate electrode and the storage capacitor bottom electrode are located in the prior art shown in FIG. 2.

In Step 3, an insulator layer, an a-Si layer, an n+ a-Si layer, and an S/D metal layer are respectively deposited on the glass substrate obtained after the Step 2, and an S/D and a channel region are formed by photolithography using a second mask.

Figure 8:
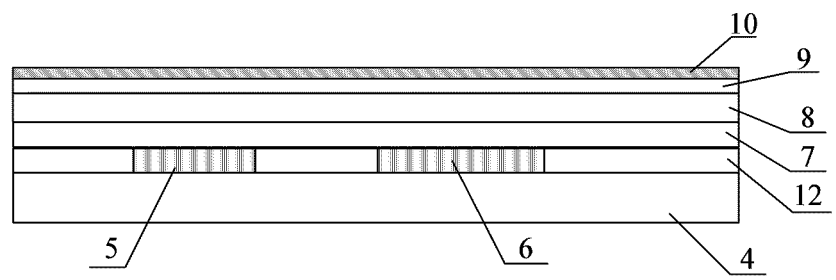
FIG. 8 is a schematic view illustrating a fifth process in the embodiment of the method for manufacturing E-paper array substrate according to the present invention.
Figure 9:
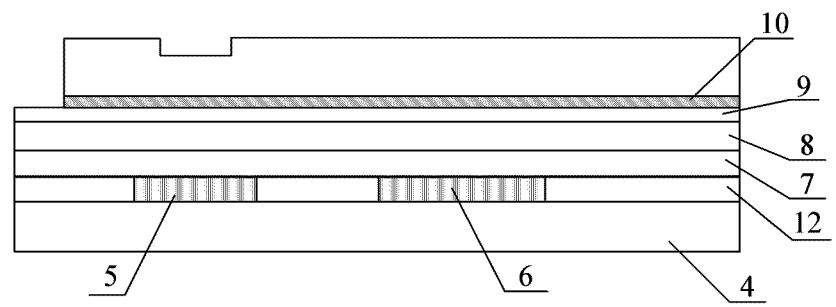
FIG. 9 is a schematic view illustrating a sixth process in the embodiment of the method for manufacturing E-paper array substrate according to the present invention.
Figure 10:
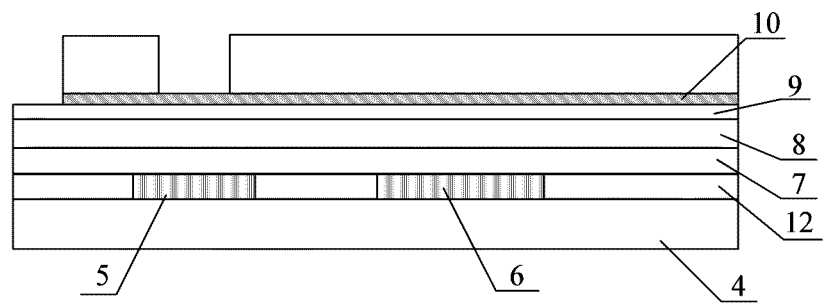
FIG. 10 is a schematic view illustrating a seventh process in the embodiment of the method for manufacturing E-paper array substrate according to the present invention.
Figure 11:
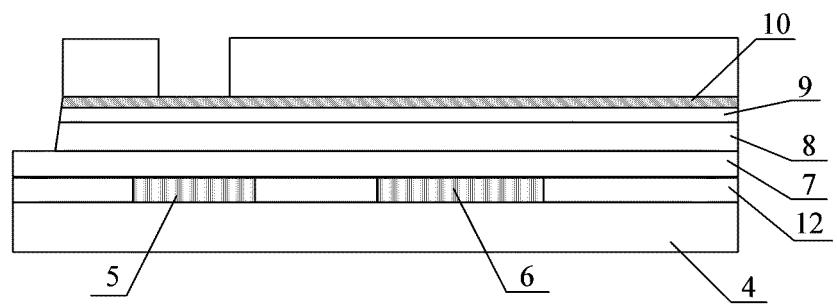
FIG. 11 is a schematic view illustrating an eighth process in the embodiment of the method for manufacturing E-paper array substrate according to the present invention.

Based on the schematic view shown in FIG. 7, an insulator layer, an a-Si layer, an n+ a-Si layer, and an S/D metal layer are respectively deposited on the glass substrate obtained after the Step 2, so as to obtain the schematic view shown in FIG. 8. Specifically, the insulator layer 7, the a-Si layer 8, and the n+ a-Si layer 9 may be respectively deposited on the metal layer using the PECVD technology, and the S/D metal layer 10 may be deposited by sputtering. Afterwards, the channel region is formed by photolithography using the second mask. The second mask is a mask containing a semi-transparent region such as HALF TONE, so as to partially expose the photoresist in the channel region. FIG. 13 is a schematic view illustrating exposure principles of the second mask in the embodiment of the method for manufacturing E-paper array substrate according to the present invention. As shown in FIG. 13, the second mask contains a semi-transparent region and a full-transparent region. In the exposure and development, the photoresist corresponding to the full-transparent region are fully exposed and removed, while the photoresist corresponding to the semi-transparent region are only partially exposed and removed. Based on the schematic view shown in FIG. 8, the channel region is formed by photolithography using the second mask. Specifically, the channel region may be formed by photolithography using the following steps. Firstly, the S/D metal layer 10 is formed by photolithography with a positive photoresist using the second mask, resulting in the schematic view shown in FIG. 9. Before the photolithography, the positive photoresist is exposed. Since the mask corresponding to the channel region is the semi-transparent region, the photoresist in the channel region is partially exposed to a thickness smaller than that of the unexposed photoresist, while since the mask corresponding to the non-channel region is the full-transparent region, the photoresist in the non-channel region is fully exposed. Secondly, the positive photoresist in the channel region is removed using the ashing technology, resulting in the schematic view shown in FIG. 10. Thirdly, the a-Si layer 8 and the n+ a-Si layer 9 in the non-channel region are etched, resulting in the schematic view shown in FIG. 11. Finally, the n+ a-Si layer 9 and the S/D metal layer 10 in the channel region are etched, resulting in the schematic view shown in FIG. 12. As can be seen from FIG. 12, the a-Si layer 8 in the channel region is partially etched due to the effect of the second mask.

In Step 4, the glass substrate obtained after the Step 3 is coated with a passivation film.

Figure 12:
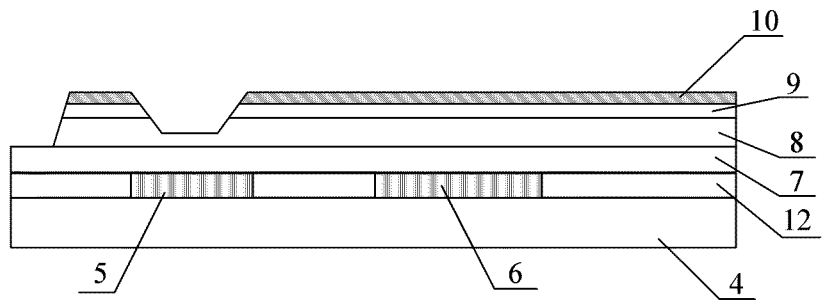
FIG. 12 is a schematic view illustrating a ninth process in the embodiment of the method for manufacturing E-paper array substrate according to the present invention.
Figure 13:
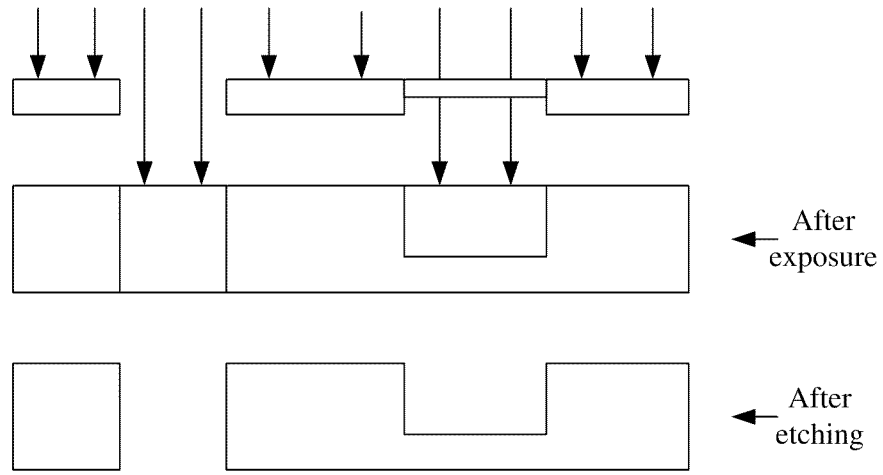
FIG. 13 is a schematic view illustrating exposure principles of a second mask in the embodiment of the method for manufacturing E-paper array substrate according to the present invention.

Based on the schematic view shown in FIG. 12, the S/D metal layer 10 is coated with a passivation film 11. The passivation film may be coated using the PECVD technology, in which the passivation film may be an SiNx thin film serving as a protective film and a passivation film of the array substrate, so as to obtain the schematic view shown in FIG. 14. After the passivation film is coated, the manufacturing process of the entire array substrate is completed. As can be seen from the array substrate manufactured using the method according to the present invention, steps existing in a TFT structure are obviously overcome. Moreover, the present invention can be implemented with two masks only, so that the number of the masks is not increased.

In this embodiment, a method for manufacturing E-paper array substrate is provided, which eliminates steps on a surface of an array substrate structure without changing the number of masks by disposing a leveling layer on a glass substrate, so as to enable a uniform distribution of a drain electric field and facilitate a subsequent coating process of E-ink, thereby enhancing the display effect of an E-paper.

Figure 14:
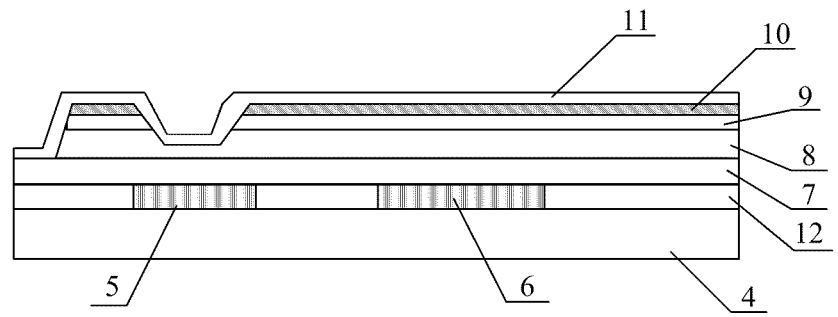
FIG. 14 is a structural view of an embodiment of an E-paper array substrate according to the present invention.

FIG. 14 is a structural view of an embodiment of an E-paper array substrate in the present invention. Referring to FIG. 14, an E-paper array substrate is provided in this embodiment, which includes a glass substrate 4, an insulating leveling layer 12, a gate electrode 5, a storage capacitor bottom electrode 6, an insulator layer 7, an a-Si layer 8, an n+ a-Si layer 9, an S/D metal layer 10, and a passivation film 11. The insulating leveling layer 12, the gate electrode 5, and the storage capacitor bottom electrode 6 together form an electrode layer with a uniform thickness, and the electrode layer is located on the glass substrate 4. Specifically, a material of the insulating leveling layer 12 may be SiNx or a photoresist.

In this embodiment, in the manufacturing of the array substrate, first, an insulating leveling layer is deposited on a glass substrate, and patterns of a gate electrode and a storage capacitor bottom electrode are formed by photolithography on the insulating leveling layer using a first mask, and then, the gate electrode and the storage capacitor bottom electrode are formed by photolithography on a metal layer using the first mask. The patterns of the gate electrode and the storage capacitor bottom electrode formed by photolithography and the gate electrode and storage capacitor bottom electrode formed by photolithography are different. They are complementary to each other, so as to together form an electrode layer with a uniform thickness. That is to say, in this embodiment, the insulating leveling layer fills the regions other than the gate electrode and the storage capacitor bottom electrode, so that the surface of the layer where the gate electrode and the storage capacitor bottom electrode are located is flat, thus overcoming the unevenness of the layer where the gate electrode and the storage capacitor bottom electrode are located in the prior art shown in FIG. 2.

In this embodiment, a substrate is provided, which eliminates steps on a surface of an array substrate structure by disposing a leveling layer, so as to enable a uniform distribution of a drain electric field and facilitate a subsequent coating process of E-ink, thereby enhancing the display effect of an E-paper.

Finally, it should be noted that the above embodiments are merely provided for describing the technical solutions of the present invention, but not intended to limit the present invention. It should be understood by those of ordinary skill in the art that although the present invention has been described in detail with reference to the foregoing embodiments, modifications can be made to the technical solutions described in the foregoing embodiments, or equivalent replacements can be made to some technical features in the technical solutions, as long as such modifications or replacements do not cause the essence of corresponding technical solutions to depart from the spirit and scope of the present invention.

What is claimed is:

1. A method for manufacturing E-paper array substrate, comprising:
   Step 1: depositing an insulating leveling layer on a glass substrate, and forming patterns of a gate electrode and a storage capacitor bottom electrode through photolithography using a first mask;
   Step 2: depositing a metal layer on the glass substrate obtained after the Step 1, and forming the gate electrode and the storage capacitor bottom electrode by photolithography using the first mask;
   Step 3: depositing an insulator layer, an amorphous silicon active layer, an n+ amorphous silicon layer and a source/drain metal layer respectively on the glass substrate obtained after the Step 2, and forming a source/drain electrode and a channel region by photolithography using a second mask, wherein the source/drain metal electrode is directly over the storage capacitor bottom electrode and wherein the entirety of the source/drain metal electrode extends over the storage capacitor bottom electrode at a uniform height; and
   Step 4: coating the glass substrate obtained after the Step 3 with a passivation film.

2. The method according to claim 1, wherein material of the insulating leveling layer is silicon nitride, silicon oxide or a photoresist.

3. The method according to claim 2, wherein when the material of the insulating leveling layer is silicon nitride or silicon oxide, the forming the patterns of the gate electrode and the storage capacitor bottom electrode by photolithography using the first mask specifically comprises: forming the patterns of the gate electrode and the storage capacitor bottom electrode by photolithography with a negative photoresist using the first mask.

4. The method according to claim 3, wherein the forming the gate electrode and the storage capacitor bottom electrode by photolithography using the first mask specifically comprises: forming the gate electrode and the storage capacitor bottom electrode by photolithography with a positive photoresist using the first mask.

5. The method according to claim 2, wherein when the material of the insulating leveling layer is a negative photoresist, the forming the patterns of the gate electrode and the storage capacitor bottom electrode by photolithography using the first mask specifically comprises: exposing and developing the insulating leveling layer using the first mask so as to obtain the patterns of the gate electrode and the storage capacitor bottom electrode.

6. The method according to claim 5, wherein the forming the gate electrode and the storage capacitor bottom electrode by photolithography using the first mask specifically comprises: forming the gate electrode and the storage capacitor bottom electrode by photolithography with a positive photoresist using the first mask.

7. The method according to claim 1, wherein the forming the source/drain electrode and the channel region by photolithography using the second mask specifically comprises:
   forming the source/drain metal layer with a positive photoresist by photolithography using the second mask;
   removing the positive photoresist in the channel region;
   etching both the amorphous silicon active layer and the n+ amorphous silicon layer in a non-channel region; and
   etching both the n+ amorphous silicon layer and the source/drain metal layer in the channel region.

* * * * *